(12) United States Patent
Littlechild et al.

(10) Patent No.: US 8,451,950 B2
(45) Date of Patent: May 28, 2013

(54) METHOD AND APPARATUS ADAPTED TO DEMODULATE A DATA SIGNAL

(75) Inventors: Stuart Colin Littlechild, Haberfield (AU); Graham Alexander Munro Murdoch, Woolstonecraft (AU)

(73) Assignee: Magellan Technology Pty Limited, Annandale, New South Wales (AU)

( * ) Notice: Subject to any disclaimer, the term of this patent is extended or adjusted under 35 U.S.C. 154(b) by 1005 days.

(21) Appl. No.: 12/066,361

(22) PCT Filed: Sep. 8, 2006

(86) PCT No.: PCT/AU2006/001316
§ 371 (c)(1),
(2), (4) Date: Jul. 1, 2008

(87) PCT Pub. No.: WO2007/030860
PCT Pub. Date: Mar. 22, 2007

(65) Prior Publication Data
US 2008/0267331 A1    Oct. 30, 2008

(30) Foreign Application Priority Data

Sep. 12, 2005    (AU) ................. 2005904988

(51) Int. Cl.
*H04L 27/22* (2006.01)
(52) U.S. Cl.
USPC ............... 375/329; 340/10.1; 340/12.11
(58) Field of Classification Search
USPC ............ 375/371, 316, 329; 340/10.1, 12.1, 340/12.11, 13.26
See application file for complete search history.

(56) References Cited

U.S. PATENT DOCUMENTS

| | | | |
|---|---|---|---|
| 3,701,023 A | 10/1972 | Fang | |
| 4,053,834 A | 10/1977 | Lerner | |
| 5,307,380 A * | 4/1994 | Kume | 375/330 |
| 6,005,638 A | 12/1999 | Blair et al. | |
| 6,034,603 A | 3/2000 | Steeves | |
| 6,061,475 A | 5/2000 | Blair | |
| 6,181,758 B1 | 1/2001 | Trimmel et al. | |
| 6,294,953 B1 | 9/2001 | Steeves | |
| 6,570,487 B1 | 5/2003 | Steeves | |
| 6,771,697 B1 * | 8/2004 | Goldstein et al. | 375/222 |
| 6,954,859 B1 | 10/2005 | Simerly et al. | |
| 7,005,985 B1 | 2/2006 | Steeves | |
| 7,271,727 B2 | 9/2007 | Steeves | |
| 7,286,158 B1 | 10/2007 | Griebenow | |

(Continued)

FOREIGN PATENT DOCUMENTS

WO    WO-99/34526    7/1999

OTHER PUBLICATIONS

Phase Jitter Modulation (PJM) used By ISO/IEC 18000-3, Mode 2, Retrieved From The Internet, <<www.magtech.com.au>> ( 6 pages ).

(Continued)

*Primary Examiner* — Shuwang Liu
*Assistant Examiner* — David Huang
(74) *Attorney, Agent, or Firm* — Winstead PC (57) ABSTRACT

The present invention relates to the field of receiving data and/or demodulating a data transmission signal. The present invention provides a method of and/or device for determining a data signal imposed on a phase jitter modulation signal. In one form, the invention relates to the field of Radio Frequency Identification (RFID), and the transmission of data between a tag and an interrogator.

20 Claims, 6 Drawing Sheets

U.S. PATENT DOCUMENTS

| | | | |
|---|---|---|---|
| 2002/0196061 A1* | 12/2002 | Atyunin et al. | 327/158 |
| 2004/0121731 A1 | 6/2004 | Walker | |
| 2005/0135501 A1 | 6/2005 | Chang | |
| 2006/0066444 A1 | 3/2006 | Steeves | |
| 2006/0071756 A1 | 4/2006 | Steeves | |
| 2007/0159338 A1 | 7/2007 | Beber et al. | |
| 2007/0205896 A1 | 9/2007 | Beber et al. | |
| 2007/0285241 A1 | 12/2007 | Griebenow et al. | |
| 2008/0042850 A1 | 2/2008 | De Witte et al. | |

OTHER PUBLICATIONS

A Comparison Of RFID frequencies Ans Protocols—White Paper, White Paper Frequency Comparison, Mar. 31, 2006, pp. 1-14, Retrieved From The Internet, <<www.magtech.com.au>> ( 14 pages ).

Amod Pradhan, "International Search Report" for PCT/AU2006/001316 as mailed Oct. 5, 2006 ( 4 pages ).

* cited by examiner

Figure 1
Example circuit for demodulating PCT/AU98/01077

Figure 7a
Waveforms of present invention

Figure 7b
Phase waveforms of PJM in present invention

METHOD AND APPARATUS ADAPTED TO DEMODULATE A DATA SIGNAL

FIELD OF INVENTION

The present invention relates to the field of receiving data and/or demodulating a data transmission signal.

In one form, the invention relates to the field of Radio Frequency Identification (RFID), and the transmission of data between a tag and an interrogator.

In another form, the present invention is suitable for recovering data received by a tag. The data signal is imposed on a carrier signal, for example a powering signal, received via an antenna.

It will be convenient to hereinafter describe the invention in relation to a signal received by a tag from an interrogator, however it should be appreciated that the present invention is not limited to that use only.

BACKGROUND ART

The discussion throughout this specification comes about due to the realisation of the inventors and/or the identification of certain prior art problems by the inventors.

The inventors have realised that in the past, data has been transmitted to RFID tags by modulation of the excitation field. Generally pulse position modulation (PPM) is used, where 100% depth amplitude modulation of the interrogation field is used. The interrogation field is turned off for short pulse periods and this is detected by the tag's processing circuitry.

The inventors have realised that to achieve high data rates whilst maintaining the transmission of power, these pulses must be short and the duty cycle must be low. Typically a duty cycle of approximately 10% is used where the pulses are 9 μs long and the average time between pulses is around 75 μs. An example of such systems is provided by ISO14443

The inventors have further realised that additionally, PPM produces relatively high level modulation product side bands. For passive tags, a stronger excitation field is required to compensate for a less efficient antenna. Emission regulations must also be kept in mind and these place restrictions on side band transmissions including modulation products that can be transmitted. This places restrictions on the maximum excitation field strength that can be used. In order to reduce the sideband levels the modulation depth can be reduced. Modulation depths of between 10% and 30% have been proposed. An example of such a system is provided by ISO18000-3 Mode 1 and an internationally recognised RFID system. For these small modulation depths the tag voltage regulation circuits connected to the tag antenna will reduce the amplitude detected by the tag through the effect of amplitude compression. The stronger the interrogation field the greater the level of amplitude compression. However, amplitude compression of the PPM signal leads to a much reduced operating range for systems using PPM.

Any discussion of documents, devices, acts or knowledge in this specification is included to explain the context of the invention. It should not be taken as an admission that any of the material forms a part of the prior art base or the common general knowledge in the relevant art in Australia or elsewhere on or before the priority date of the disclosure and claims herein.

An object of the present invention is to provide an improved data reception and/or demodulation method and apparatus.

A further object of the present invention is to alleviate at least one disadvantage associated with the prior art.

SUMMARY OF INVENTION

The present invention provides a method of and/or device for determining a data signal imposed on a Phase Jitter Modulation (PJM) signal, the method comprising the steps of providing a first phase jitter modulated signal, applying a delay to the first signal, and obtaining a second signal, comparing the first and second signals, determining the phase difference between the first and second signals, and reconstructing a data signal based on the phase difference.

Other aspects and preferred aspects are disclosed in the specification and/or defined in the appended claims, forming a part of the description of the invention.

Whilst, the inventors have realised that as an alternative to PPM, phase modulation has significant advantages in that bandwidth is narrower compared to PPM and thus significant data rate increases are possible. The detection of a phase modulated signal would typically be performed by a PLL. The inventors have realised that the purpose of a PLL in a prior art circuit is in effect to provide a stable phase reference. But in practice, although the phase of the PLL does not move quickly, but it does move slowly (drift), in a data dependant manner, resulting in Intersymbol Interference (ISI). The phase of a PLL may also be 'moved' a little in response to a, noise spike, for example. These spikes also cause noise at the circuit output as the PLL re-adjusts itself. In the present invention, a relatively fixed reference is provided in a form which is considered to be relatively more stable, offer lower noise and is relatively more adaptable for ASIC integration.

The present invention relates to an improvement on the method and apparatus disclosed in co-pending applications based on PCT/AU98/01077, the disclosure of which is herein incorporated by reference. PCT/AU98/01077 discloses the use of a Phased Locked Loop (PLL) as a part of the demodulation circuitry. It has been realised by the inventors that the PLL tends to 'drift' in response to an input change in the PJM signal. This is known to cause Inter-Symbol Interference (ISI). The inventors have further found that a PLL may tend to suffer from noise associated problems, and that an improved form of signal detection is required as the signal being demodulated in order to obtain data is relatively weak as compared to the carrier signal. It would be also advantageous if the demodulation circuit is more readily adapted for VSLI, integration into 'chip' form.

The present invention provides a relatively fixed reference in the form of a delay, such as a delay line. A delay, and implemented in a PJM detector, according to the present Invention has been found to not drift; it is relatively 'fixed', Tests have found that in response to a noise spike, the noise simply propagates the delay line, without substantial effect on the delay time. In tests of the present invention, improved noise performance has been found to be in the order of approx 20 dB less noise compared to an equivalent PLL.

In the present invention, a delay line (DLL) is used and it operates within the data demodulation circuit to assist in the detection of Phase Jitter Modulation, but substantially without distorting the signal from which the data is to be obtained. The DLL may detect phase edges, such -as by way of a window detector.

The present invention is applicable to various forms of tag(s) and/or interrogator(s). Thus, the nature of the data transmitted according to the present invention is not essential and the tag and I or interrogator whether active and/or passive is not essential to the present invention. A tag may be a transponder.

The present invention has been found to result in a number of advantages, such as:
  Relatively low noise
  Relatively little ISI, and in many cases, no ISI
  Relatively simple to implement in an ASIC
  The circuit implementation is relatively stable in operation,
  Relatively small area on silicon, and
  Uses conventional devices and production processes Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further disclosure, objects, advantages and aspects of the present application may be better understood by those skilled in the relevant art by reference to the following description of preferred embodiments taken in conjunction with the accompanying drawings, which are given by way of illustration only, and thus are not limitative of the present invention, and in which.

DETAILED DESCRIPTION

Figure 1:
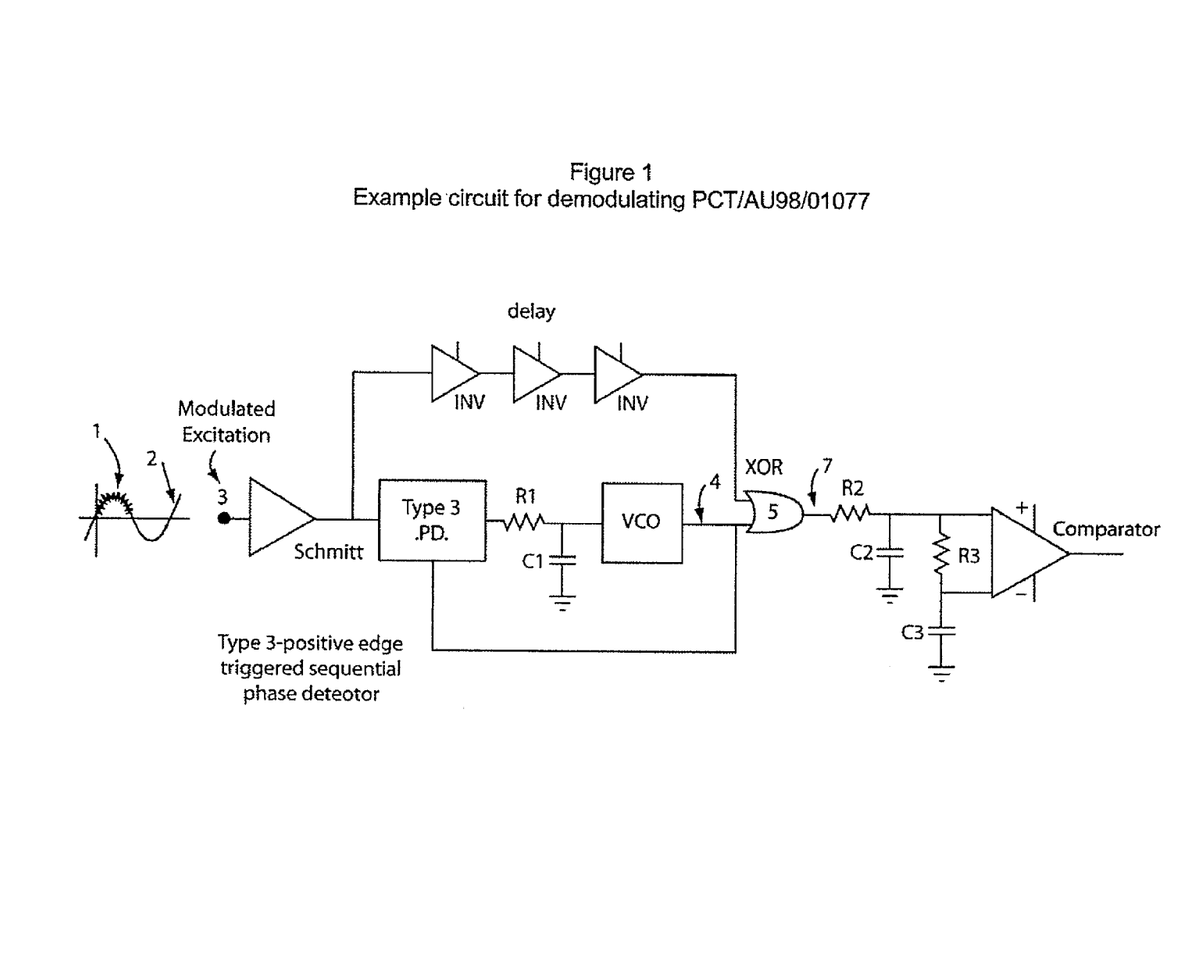
FIG. 1 illustrates a circuit disclosed in PCT/AU98/01077.
Figure 2:
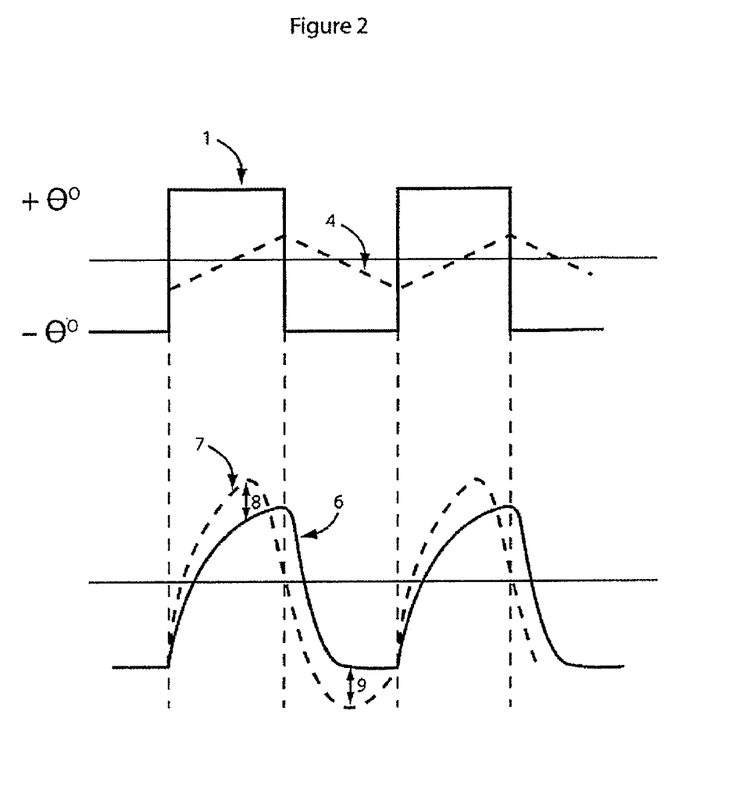
FIG. 2 illustrates the various signals and waveforms associated with the operation of the circuit of FIG. 1, FIG. 3 provides a schematic representation of the present invention.

Referring to FIGS. 1 and 2 together, the signal 1 represented in FIG. 2 is a phase signal formed on a carrier signal 2 which is modulated excitation 3 input in FIG. 1. FIG. 2 illustrates more clearly the phase signal I which is imposed on the carrier signal 2 of FIG. 1. Also illustrated in FIG. 1 is a Phase Locked Loop (PLL) tracking signal 4. That is the effect of the phase signal on the circuit configuration of FIG. 1, in operation, is that the PLL 'drifts'.

Figure 3:
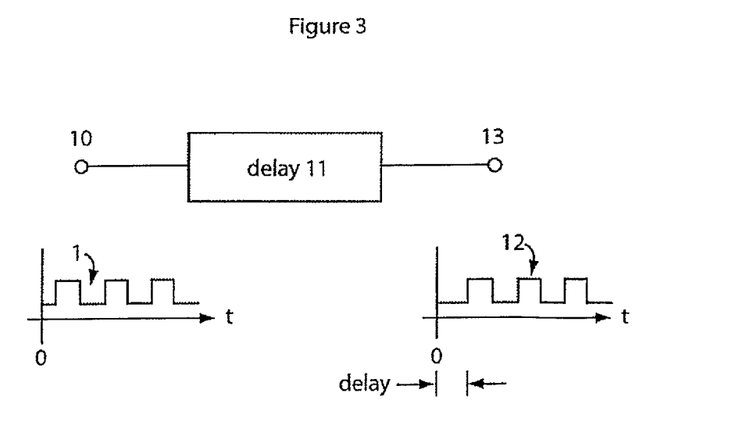

Also illustrated in FIG. 2 is a representation 6 of an 'ideal' recovered signal from the output of the XOR gate 5 of FIG. 1. However, in practice; the recovered signal from the output of the XOR gate 5 in FIG. 1 is more like signal 7 illustrated in FIG. 2. In FIG. 2, the difference between the 'ideal' signal 6 and the actual recovered signal 7 is shown, in part, by numerals 8 and 9. This difference is referred to as ISI. The inventors have found that the PLL has an inherent operational transient response which causes ISI. The problem(s) associated with ISI are:
  Distorts the recovered waveform
  Moves recovered data edges from a correct position depending on the preceding recovered data FIG. 3 illustrates schematically the present invention. In essence, in one aspect, the use of a delay in the demodulation of the PJM signal, has been found to overcome the problem of signal distortion. As illustrated in FIG. 3, the 'shape' phase signal 1 which forms an input signal 10 to the delay 11 is relatively preserved when observing the delayed signal 12 at the output 13. Compare this with the 7 as shown in FIG. 2.

Figure 4:
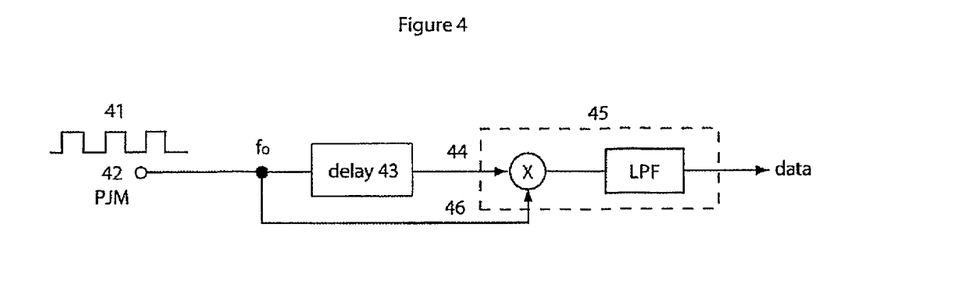
FIG. 4 illustrates an embodiment of the present invention.

FIG. 4 illustrates a relatively basic representation of one embodiment of the present invention. A PJM signal 41 having a phase modulated signal applied to a carrier signal Of is applied to an input 42 of the demodulation circuit according to the present invention. The applied signal is delayed 43, providing a delayed signal 44 which is input to a differential phase detector 45 together with a further input signal provided on path 46. In one embodiment, the differential phase detector obtains an output signal 2Fo+data. This mixer output is applied to a Low Pass Filter (LPF), and the resultant (output) from the differential phase detector is the data signal.

In one form, it is preferred-that the delay 43 is shorter than the bit interval of the PJM signal 41. In another form, and with the PJM signal at a carrier frequency of 13.56 MHz, a delay of approximately 10 carrier cycles has been found to perform well, but which does vary with the data rate. In yet another form, setting the delay to substantially half or less of the bit interval of the (data) signal 41 has been found to enable operation of the present invention. In yet another form setting the delay to ¼ or less of a bit interval has been found to enable operation of the present invention. The differential phase detector may comprise an XOR gate and a LPF. Alternatively, the phase detector may be any one or a combination of any of a digital vernier, mixer, multiplier or XOR gate.

Figure 5:
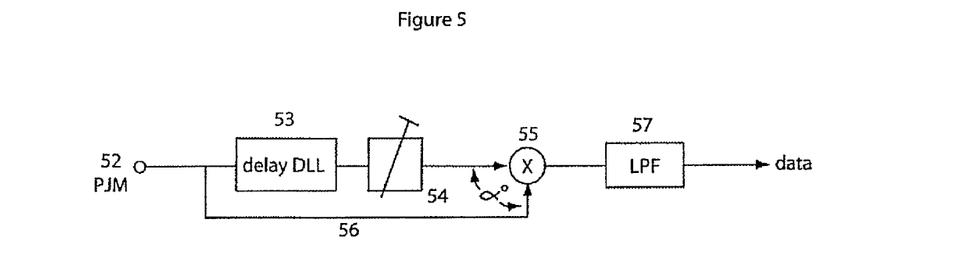
FIG. 5 illustrates another embodiment of the present invention.

FIG. 5 illustrates a further embodiment of the present invention. A PJM signal is applied at input 52. A delay line may comprises, for example a fixed delay (DLL) 53 and a variable delay 54. The purpose of the variable delay 54 will be detailed shortly. It has been found by the inventors that for optimum operation, the phase angle difference $\alpha°$ between the delay line 53/54 and path 56 should be maintained in the linear portion of the phase detector's characteristics, For an XOR gate this is between 0° and 180°, most preferably 90°, or between 180° and 360°, most preferably 270°. For an XOR gate operation around or close to 0°, 180°, or 360° should be avoided as the slope of the phase characteristic changes sign leading to distortion in the recovered phase signal. The purpose of the variable delay 54 is to ensure, in operation of the present invention, that the difference $\alpha°$ is not close to 0°, 180° or 360°. Preferably the variable delay maintains the difference $\alpha°$ around substantially 90° or 270°, although, as described above, the delay or phase angle may be anywhere between 0° and 180° or 180° and 360°. Other phase detectors may have different characteristics and the purpose of the variable phase delay would be to operate these detectors in 'good' regions of their detection characteristics and away from 'bad' regions, The differential detector 45 of FIG. 4 is represented as an XOR gate 55 and a LPF 57. Other suitable arrangements may be used as a differential detector, such as an analogue mixer or analogue multipliers.

Figure 6:
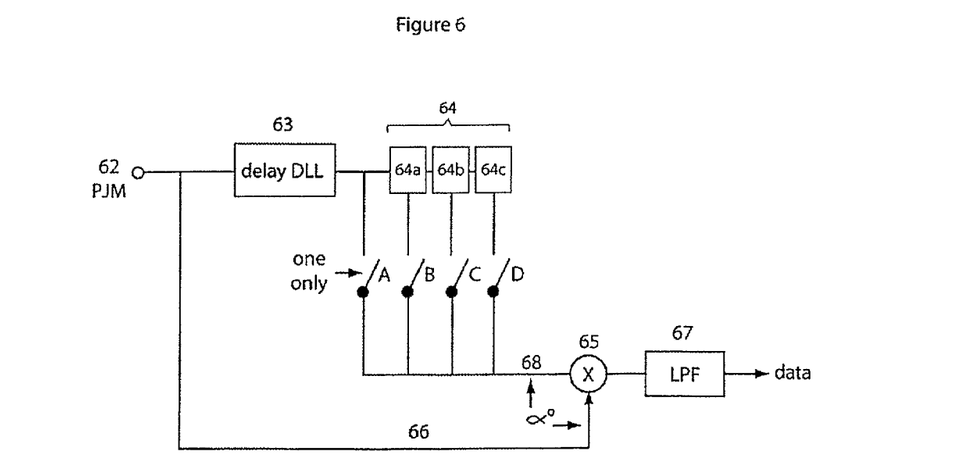
FIG. 6 illustrates yet another embodiment of the present invention.

FIG. 6 illustrates a further embodiment of the present invention, in which the adjustable delay 54 of FIG. 5 is represented as a number of selectable delays 64 by way of switches A, B, C or D. Only one switch is selectable in the arrangement illustrated. Delays 64a, 64b, 64c may be selectable or predetermined as required by the particular application, For example, the delays 64a, 64b and/or 64c may be substantially 45°. Switch A, when closed serves to have the present invention provide a delay α° of only DLL 63. Switch B, when closed serves to have the present invention provide a delay α° of DLL 63 and DLL 64a. Switch C, when closed serves to have the present invention provide a delay α of DLL 63, DLL 64a and DLL 64b. Switch D, when closed serves to have the present invention provide a delay α° of DLL 63, DLL 64a, DLL64b and DLL64c. In this way, the phase angle difference α° can be maintained between 0° and 180° or between 180° and 360° but not close to 0°, 180° or 360°.

This embodiment has been designed with ASIC integration in mind also. It has been realised by the inventors that an exclusive OR gate (XOR gate) 65 is readily integratable, and that a delay DLL 63, 64, etc and switches A to D are all relatively easily integratable. Moreover a short delay of less than one bit period and preferably ¼ or less of a bit period is relatively easily integratable.

Figure 7A:
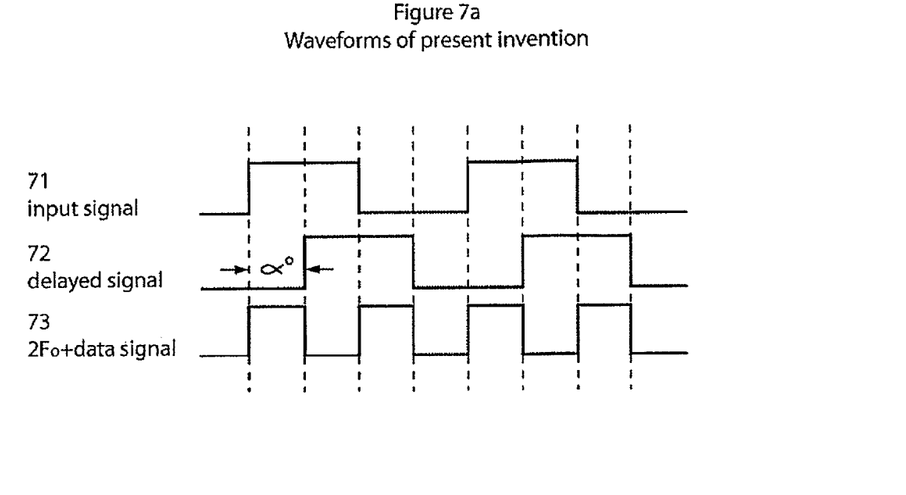
FIGS. 7a and 7b illustrate the various waveforms associated with the present, invention.

FIG. 7a illustrates the various waveforms of the present invention, There is an input waveform 71 (for example as applied to input 62 of FIG. 6), a delayed waveform 72 (for example on path 68 in FIG. 6), having a delay D with a phase angle difference Δ°(maintained between 0° and 180° or between 180° and 360° but not close to 0°, 180°or 360°), and a resultant 2 Fo+data waveform 73, where the data is present as relatively small changes in the duty cycle of the waveform 73.

Figure 7B:
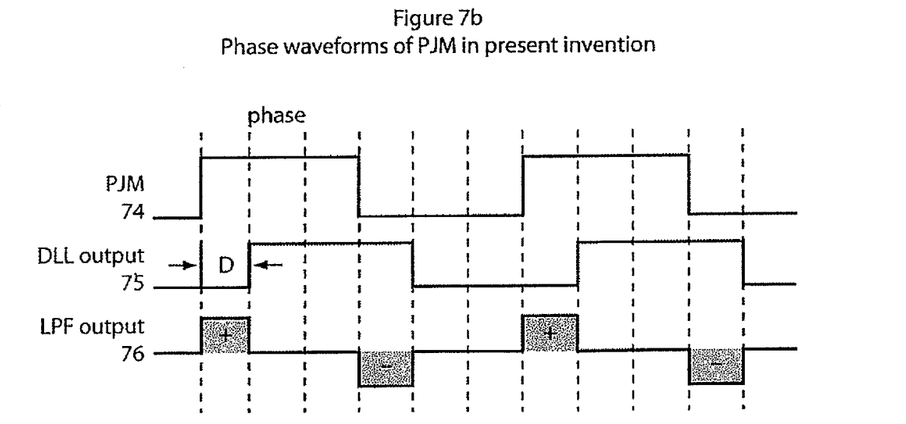
Figure 8:
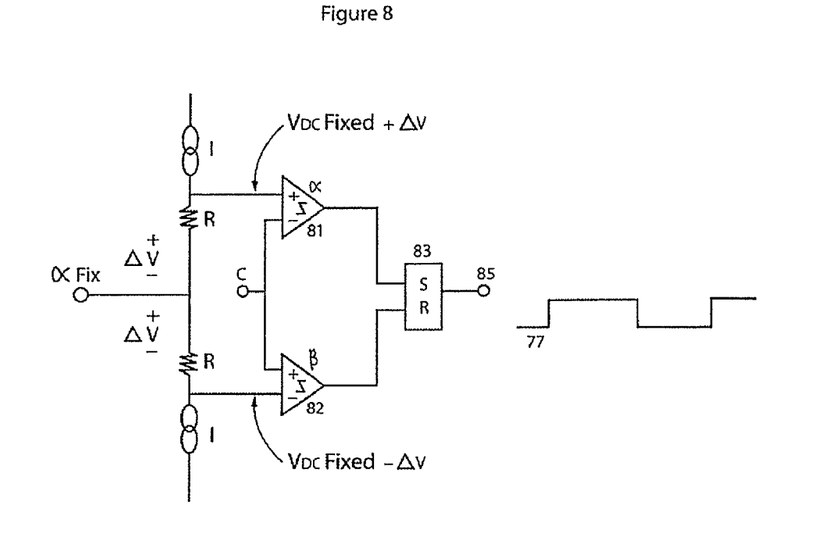
FIG. 8 illustrates one embodiment of a window detector according to one embodiment of the present invention.

FIG. 7b illustrates a phase angle of the PJM data 74, the phase of the signal delayed by delay line length D is shown as 75 and the output of the LPF filter (which is relatively small in amplitude as compared to the PJM signal) is shown by 76. The output 76 consists of a discrete phase differential of the PJM signal with a positive voltage pulse produced by a positive phase change and a negative voltage pulse produced by a negative phase change The output of the LPF, for example LPF 67 of FIG. 6, may be input into a window detector. FIG. 8 illustrates one embodiment of a window detector. The waveform 76 is applied to input c of FIG. 8 and the average DC value of wave form 76 is applied to DC fix input of FIG. 8. The comparator 81 and 82 then detect the positive and negative going pulses of 76. The positive pulse 'sets' the flip-flop 83 and the negative going pulses 'resets' the flip-flop 83. This results in a waveform 77 in FIG. 7, which is substantially the same as the PJM data 74.

Figure 9:
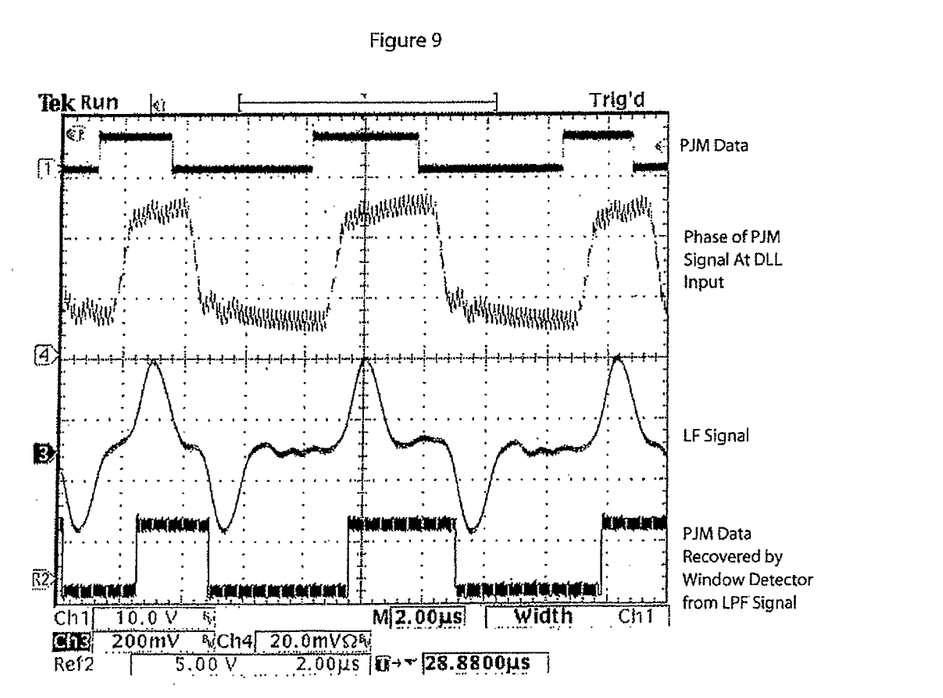
FIG. 9 shows actual waveforms associated with the circuits shown in FIG. 6 and FIG. 8.

FIG. 9 shows actual waveforms associated with the circuits shown in FIGS. 6 and FIGS. 8. The PJM data (first trace) is used to PJM modulate a signal resulting in the phase modulated signal shown (second trace). The recovered signal at the output of the LPF is shown (third trace) and consists of positive and negative pulses, the pulses being filtered by the action of the LPF. The data recovered by a window detector is then shown (fourth trace).

Figure 10:
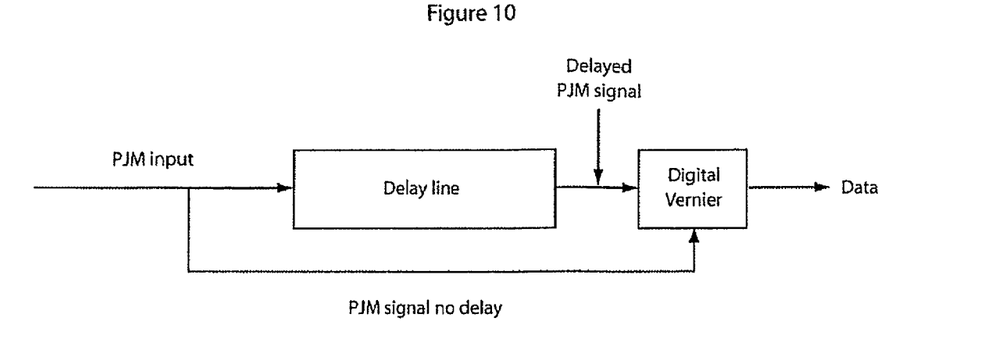
FIG. 10 shows an embodiment of the invention that uses a digital vernier to directly detect the PJM signal.

FIG. 10 shows an embodiment of the invention that uses a digital vernier to directly detect the PJM signal. The digital vernier adjusts the phase of the delayed PJM signal so that it exactly coincides with the phase of the PJM signal with no delay. The vernier circuits can then detect the tiny relative phase shifts that occur due to PJM. A digital vernier has the advantage of not requiring phase detecting element with a LPF.

Figure 11A:
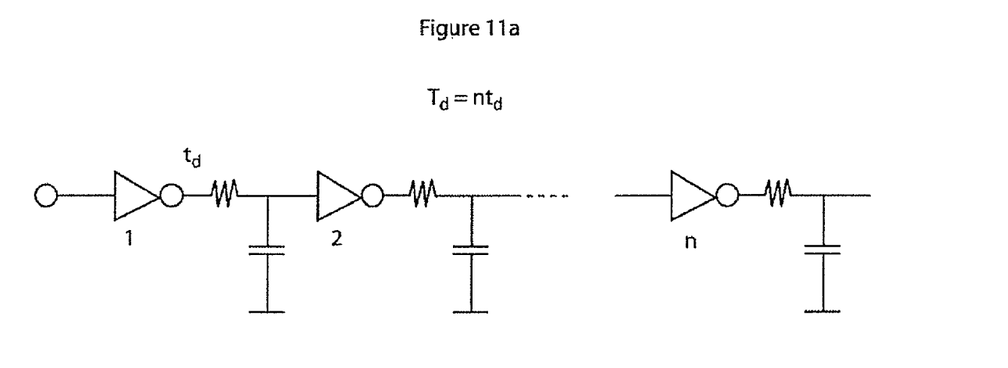
FIGS. 11A and 11B show two embodiments of a delay line applicable to the present invention.

Figure. 11A shows an example of a delay line which uses a discrete resistance R and Capacitance C to achieve a small fixed delay $t_d$. If n stages are concatenated, the total delay will be T=n $t_d$.

For example, where the invention is used in a 13.56 MHz system, the 10 carrier cycles around 740 nSec. If R and C are chosen to give a 10 nsec delay, then n=74 will give a total delay of 740 nsec.

Figure 11B:
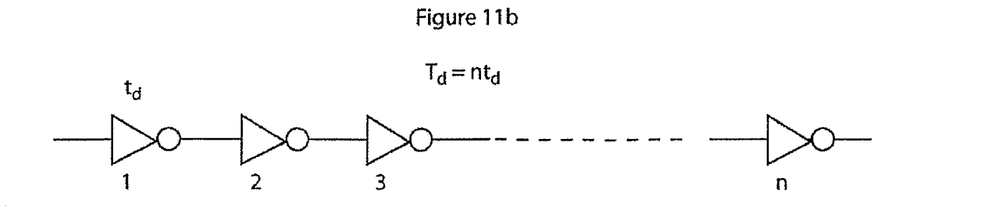

FIG. 11 B shows an example of a delay line which is readily integratable into an ASIC. The propagation delay through each inverter is $t_d$ and the total delay for n stages is Tn=n $t_d$.

$t_d$ is set by designing the characteristics of the inverters, $t_d$ can be adjusted a small amount by varying the supply voltage to the inverter.

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures. For example, although a nail and a screw may not be structural equivalents in that a nail employs a cylindrical surface to secure wooden parts together, whereas a screw employs a helical surface to secure wooden parts together, in the environment of fastening wooden parts, a nail and a screw are equivalent structures.

"Comprises/comprising" when used in this specification is taken to specify the presence of stated features, integers, steps or components but does not preclude the presence or addition of one or more other features, integers, steps, components or groups thereof." Thus, unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

The claims defining the invention are as follows:

1. A method of determining a data signal imposed on a phase jitter modulation (PJM) signal, the method comprising the steps of:

providing a first phase jitter modulated signal;

applying a delay of less than one bit period to the first phase jitter modulated signal and obtaining a second phase jitter modulated signal;

comparing the first and second phase jitter modulated signals;

determining a phase difference as a result of the comparison between the first and second phase jitter modulated signals;

generating a recovery signal based on the comparison; and reconstructing a data signal based on the recovery signal and an average DC value of the recovery signal.

2. The method as claimed in claim 1, wherein the delay is a variable delay.

3. The method as claimed in claim 1, wherein the phase difference is determined by an XOR gate.

4. The method as claimed in claim 1, wherein the phase difference is determined by a mixer.

5. The method as claimed in claim 1, wherein the phase difference is determined by a multiplier.

6. The method as claimed in claim 1, wherein the phase difference is determined by a digital vernier circuit.

7. The method as claimed in claim 1, wherein the delay is less than half of a bit period.

8. The method as claimed in claim 1, wherein the delay is less than one quarter of a bit period.

9. The method as claimed in claim 1, wherein the method is applied in an RFID system.

10. A device adapted to demodulate a data signal imposed on a phase jitter modulation (PJM) signal, comprising:
   a receiver adapted to receive a first phase jitter modulated signal;
   delay means adapted to apply a delay of less than one bit period to the first phase jitter modulated signal and obtain a second phase jitter modulated signal;
   logic means adapted to compare the first and second phase jitter modulated signals, determine a phase difference as a result of the comparison between the first and second phase jitter modulated signals and generate a recovery signal based on the comparison; and
   a window detector configured to receive the recovery signal to reconstruct a data signal based on the recovery signal and an average DC value of the recovery signal.

11. The device as claimed in claim 10, wherein the delay is a variable delay.

12. The device as claimed in claim 10, wherein the phase difference is determined by an XOR gate.

13. The device as claimed in claim 10, wherein the phase difference is determined by a mixer.

14. The device as claimed in claim 10, wherein the phase difference is determined by a multiplier.

15. The device as claimed in claim 10, wherein the phase difference is determined by a digital vernier circuit.

16. The device as claimed in claim 10, wherein the delay is less than half of a bit period.

17. The device as claimed in claim 10, wherein the delay is less than one quarter of a bit period.

18. The device as claimed in claim 10, wherein the device is an RFID device.

19. The device as claimed in claim 18, wherein the device is a tag, transponder or interrogator.

20. A RFID system including a device, the device adapted to demodulate a data signal imposed on a phase jitter modulation (PJM) signal, the device comprising:
   a receiver adapted to receive a first phase jitter modulated signal;
   delay means adapted to apply a delay of less than one bit period to the first phase jitter modulated signal and obtain a second phase jitter modulated signal;
   logic means adapted to compare the first and second phase jitter modulated signals, determine a phase difference as a result of the comparison between the first and second phase jitter modulated signals and generate a recovery signal based on the comparison; and
   a window detector configured to receive the recovery signal to reconstruct a data signal based on the recovery signal and an average DC value of the recovery signal.

\* \* \* \* \*

UNITED STATES PATENT AND TRADEMARK OFFICE
CERTIFICATE OF CORRECTION

PATENT NO. : 8,451,950 B2  
APPLICATION NO. : 12/066361  
DATED : May 28, 2013  
INVENTOR(S) : Stuart Colin Littlechild et al.

Page 1 of 1

It is certified that error appears in the above-identified patent and that said Letters Patent is hereby corrected as shown below:

In the Specification

Column 4, Line 16

Replace "Of"  
With -- Fo --

Signed and Sealed this  
Twenty-sixth Day of November, 2013

Margaret A. Focarino  
*Commissioner for Patents of the United States Patent and Trademark Office*

UNITED STATES PATENT AND TRADEMARK OFFICE
CERTIFICATE OF CORRECTION

PATENT NO. : 8,451,950 B2
APPLICATION NO. : 12/066361
DATED : May 28, 2013
INVENTOR(S) : Littlechild et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1177 days.

Signed and Sealed this
Eighth Day of September, 2015

Michelle K. Lee
*Director of the United States Patent and Trademark Office*